(12) United States Patent
Liu

(10) Patent No.: US 9,502,512 B2
(45) Date of Patent: Nov. 22, 2016

(54) TRENCH POWER METAL OXIDE SEMICONDUCTOR FIELD EFFECT TRANSISTOR AND EDGE TERMINAL STRUCTURE INCLUDING AN L-SHAPED ELECTRIC PLATE CAPABLE OF RAISING A BREAKDOWN VOLTAGE

(71) Applicant: Excelliance MOS Corporation, Hsinchu County (TW)

(72) Inventor: Chu-Kuang Liu, Hsinchu County (TW)

(73) Assignee: Excelliance MOS Corporation, Hsinchu County (TW)

( * ) Notice: Subject to any disclaimer, the term of this patent is extended or adjusted under 35 U.S.C. 154(b) by 0 days.

(21) Appl. No.: 14/819,450

(22) Filed: Aug. 6, 2015

(65) Prior Publication Data

US 2015/0340494 A1    Nov. 26, 2015

Related U.S. Application Data

(62) Division of application No. 13/610,897, filed on Sep. 12, 2012, now Pat. No. 9,153,652.

(30) Foreign Application Priority Data

May 24, 2012  (TW) .............................. 101118584 A
May 24, 2012  (TW) .............................. 101209918 U

(51) Int. Cl.
| | |
|---|---|
| *H01L 29/66* | (2006.01) |
| *H01L 29/40* | (2006.01) |
| *H01L 29/78* | (2006.01) |
| *H01L 29/739* | (2006.01) |
| *H01L 29/423* | (2006.01) |

(Continued)

(52) U.S. Cl.
CPC ......... *H01L 29/404* (2013.01); *H01L 29/0661* (2013.01); *H01L 29/407* (2013.01); *H01L 29/41741* (2013.01); *H01L 29/4236* (2013.01); *H01L 29/7393* (2013.01); *H01L 29/7397* (2013.01); *H01L 29/7811* (2013.01); *H01L 29/7813* (2013.01); *H01L 29/7827* (2013.01); *H01L 29/8725* (2013.01); *H01L 29/41766* (2013.01)

(58) Field of Classification Search
None
See application file for complete search history.

(56) References Cited

U.S. PATENT DOCUMENTS

2013/0168761 A1\*  7/2013  Hsieh ................... H01L 29/407
                                                      257/330

\* cited by examiner

*Primary Examiner* — Jay C Chang
(74) *Attorney, Agent, or Firm* — Jianq Chyun IP Office

(57) ABSTRACT

An edge terminal structure of a trench power semiconductor device includes a first conductive-type substrate, a first conductive-type epitaxial layer thereon, a first electrode on a surface of the first conductive-type epitaxial layer, a second electrode on a back of the first conductive-type substrate, a first and a second field plates. The trench power semiconductor device includes an active area and an edge terminal area. A trench is in the surface of the first conductive-type epitaxial layer. The first field plate includes an L-shaped electric-plate, a gate insulation layer below the L-shaped electric-plate, and the first electrode on the L-shaped electric-plate. The second field plate includes a portion of the first electrode and an insulation layer between the portion of the first electrode and the first conductive-type epitaxial layer. The insulation layer covers the tail of the trench and completely covers the L-shaped electric-plate.

7 Claims, 3 Drawing Sheets

(51) Int. Cl.
*H01L 29/417* (2006.01)
*H01L 29/06* (2006.01)
*H01L 29/872* (2006.01)

TRENCH POWER METAL OXIDE SEMICONDUCTOR FIELD EFFECT TRANSISTOR AND EDGE TERMINAL STRUCTURE INCLUDING AN L-SHAPED ELECTRIC PLATE CAPABLE OF RAISING A BREAKDOWN VOLTAGE

CROSS-REFERENCE TO RELATED APPLICATION

This application is a divisional application of and claims the priority benefit of an application Ser. No. 13/610,897, filed on Sep. 12, 2012, now allowed, which claims the priority benefits of Taiwan application serial no. 101118584, filed on May 24, 2012, and Taiwan application serial no. 101209918, filed on May 24, 2012. The entirety of the above-mentioned patent application is hereby incorporated by reference herein and made a part of this specification.

BACKGROUND OF THE INVENTION

1. Field of the Invention

The invention relates to a power semiconductor technique. More particularly, the invention relates to an edge terminal structure and a trench power metal oxide semiconductor field effect transistor.

2. Description of Related Art

A power semiconductor device is often applied to a switch mode power supply or other high-speed power switches. According to requirements of the power semiconductor device, an active area of the device needs to allow large current to pass through, and the terminal area of the device needs to withstand large breakdown voltage.

At present, several power semiconductor devices (e.g., the barrier Schottky diode) have been developed and employed. Since the breakdown voltage of the normal planar barrier Schottky diode is not high enough, a trench metal oxide semiconductor barrier Schottky (TMBS) diode shown in FIG. 1 has been developed recently.

With reference to FIG. 1, in the TMBS diode 10, an N– epitaxial layer 102 is formed on an N+ substrate 100, a plurality of trench gates 104 are formed in the N– epitaxial layer 102, and a gate oxide layer 106 is configured between the trench gates 104 and the N– epitaxial layer 102. A barrier Schottky metal layer 108 and an anode metal 110 are then deposited on a surface of the N– epitaxial layer 102 and surfaces of the trench gates 104.

FIG. 1 merely illustrates the structure of an active area, and how to design an edge terminal structure adapted to the TMBS diode 10 has become one of the key research topics in various fields. For instance, U.S. Pat. No. 6,309,929 and U.S. Pat. No. 6,396,090 have both disclosed similar concepts.

In addition to the TMBS diode, other power semiconductor devices such as a trench power metal oxide semiconductor field effect transistor (MOSFET), a trench insulated gate bipolar transistor (IGBT), etc. have also encountered the same issues.

SUMMARY OF THE INVENTION

The invention is directed to an edge terminal structure of a trench power semiconductor device capable of raising a breakdown voltage.

The invention is further directed to a trench power metal oxide semiconductor field effect transistor having an edge terminal structure which is capable of raising a breakdown voltage.

In an embodiment of the invention, an edge terminal structure of a trench power semiconductor device is provided. The power semiconductor device is a trench power metal oxide semiconductor field effect transistor. The edge terminal structure includes a first conductive-type substrate, a first conductive-type epitaxial layer, a first electrode, a second electrode, a first field plate, and a second field plate. The trench power semiconductor device includes an active area and an edge terminal area. The first conductive-type epitaxial layer formed on the first conductive-type substrate, and a trench is located in a surface of the first conductive-type epitaxial layer in the edge terminal area beside the active area. The first electrode located on the surface of the first conductive-type epitaxial layer. The second electrode located on a back of the first conductive-type substrate. The first field plate disposed on a sidewall of the trench extends toward a tail of the trench and includes at least an L-shaped electric-plate, a gate insulation layer below the L-shaped electric-plate, and the first electrode on the L-shaped electric-plate. The second field plate includes a portion of the first electrode and at least an insulation layer between the portion of the first electrode and the first conductive-type epitaxial layer. The insulation layer covers the tail of the trench and completely covers the L-shaped electric-plate.

According to an embodiment of the invention, the edge terminal structure further has a conductive plug that passes through the insulation layer and is electrically connected to the first electrode and the L-shaped electric-plate. Besides, a barrier layer is located on a surface of the insulation layer and located among the conductive plug, the first electrode, the L-shaped electric-plate, and the insulation layer.

In an embodiment of the invention, a trench power metal oxide semiconductor field effect transistor having the aforesaid edge terminal structure is provided. The trench power metal oxide semiconductor field effect transistor further includes a plurality of trench gates located in the surface of the first conductive-type epitaxial layer in the active area, and the first electrode is also located on the surface of the first conductive-type epitaxial layer in the active area.

According to an embodiment of the invention, the first electrode is a source, and the second electrode is a drain.

According to an embodiment of the invention, the trench power metal oxide semiconductor field effect transistor has a first conductive plug electrically connected to the first electrode and the L-shaped electric-plate and a second conductive plug that passes through the insulation layer and is electrically connected to the first electrode and the first conductive-type epitaxial layer in the active area. Besides, a barrier layer is located on a surface of the insulation layer and located among the two conductive plugs, the first electrode, the L-shaped electric-plate, and the insulation layer.

In view of the above, not only the first field plate is formed in the edge terminal structure of the trench power semiconductor device, the second filed plate (e.g., a metal electrode) covering the first field plate and extending outward is also applied. Thereby, the breakdown voltage of the device may be increased.

Other features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide further understanding, and are incorporated in and constitute

DETAILED DESCRIPTION OF DISCLOSED EMBODIMENTS

In an embodiment of the invention, an edge terminal structure of a trench power semiconductor device is provided, and the edge terminal structure is applicable to a TMBS diode, a trench IGBT, a trench power MOSFET, or the like trench power semiconductor device. Several embodiments are provided below to elaborate the edge terminal structure.

Figure 1:
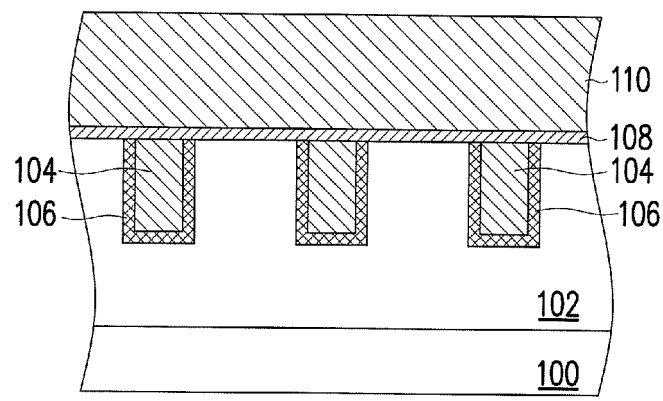
FIG. 1 is a schematic view illustrating a conventional TMBS diode.
Figure 2A:
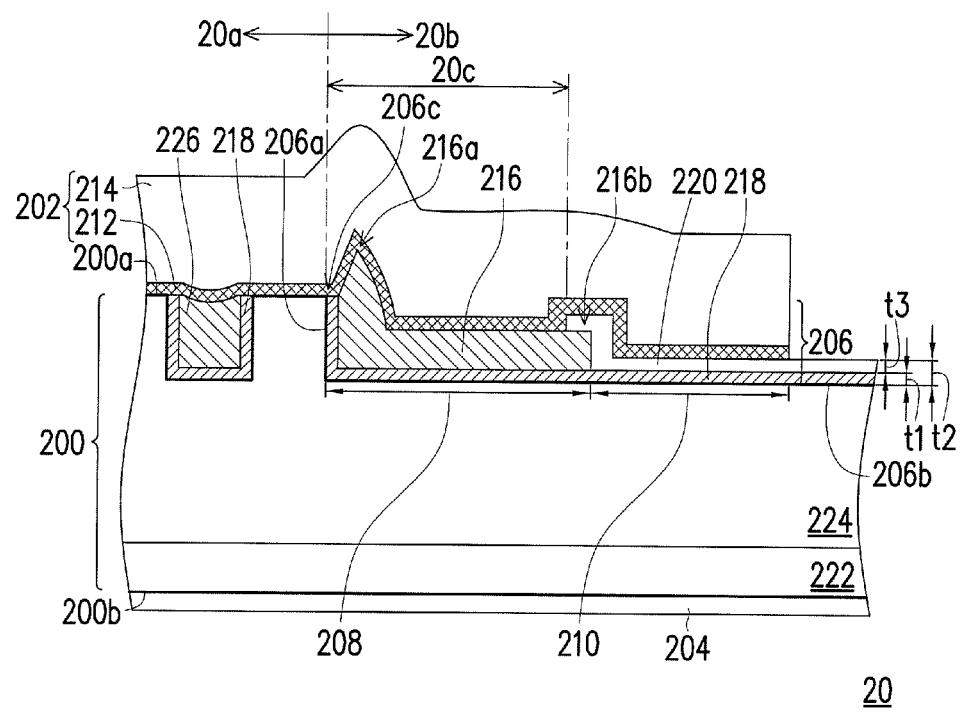
FIG. 2A is a schematic cross-sectional view illustrating a TMBS diode according to a first embodiment of the invention.

FIG. 2A is a schematic cross-sectional view illustrating a TMBS diode according to a first embodiment of the invention. In FIG. 2A, the TMBS diode 20 includes an active area 20a and an edge terminal area 20b.

With reference to FIG. 2A, the TMBS diode 20 basically includes a substrate 200, a first electrode 202 (i.e., the anode), and a second electrode 204 (i.e., the cathode). The first electrode 202 is located on a surface 200a of the substrate 200, and the second electrode 204 is disposed on a back 200b of the substrate 200. A trench 206 is formed in the surface 200a of the substrate 200 in the edge terminal area 20b beside the active area 20a. A first field plate 208 and a second field plate 210 are disposed in the trench 206. The first field plate 208 is located on a sidewall 206a of the trench 206 and extends toward a tail 206b of the trench 206. The first electrode 202 includes a barrier Schottky metal layer 212 and an overlying anode metal layer 214. Besides, the first electrode 202 extends from the active area 20a to the tail 206b of the trench 206 and covers the first field plate 208. Therefore, a length of the first field plate 208 is less than that of the first electrode 202 in the edge terminal area 20b. For instance, the length of the first field plate 208 is at least 5 μm approximately, e.g., 5 μm~20 μm, but the invention is not limited thereto. The anode metal layer 214 is made of a metal material, such as AlSiCu or the like.

As shown in FIG. 2A, the first field plate 208 includes an L-shaped electric-plate 216, a gate insulation layer 218 below the L-shaped electric-plate 216, and the anode metal layer 214 above the L-shaped electric-plate 216. Here, a top side 216a of the L-shaped electric-plate 216 is higher than a top 206c of the trench 206. The L-shaped electric-plate 216 is made of polysilicon, for instance. The second field plate 210 includes at least an insulation layer 220 and the anode metal layer 214 above the insulation layer 220. The insulation layer 220 covers the tail 206b of the trench 206 and extends at least to cover a tail 216b of the L-shaped electric-plate 216. Here, the insulation layer 220 may be made of a material suitable for forming an inner-layer dielectric (ILD) layer. The second field plate 210 is electrically connected to the first field plate 208 through a terminal area contact window 20c. Hence, the length of the first field plate 208 is slightly greater than that of the terminal area contact window 20c, and the length of the second field plate 210 is at least 5 μm approximately, e.g., 5 μm~20 μm, but the invention is not limited thereto. Thereby, the depletion region of the TMBS diode 20 may be expanded toward the edge of the device according to the first and second field plates 208 and 210, so as to further increase the breakdown voltage.

As indicated in FIG. 2A, the gate insulation layer 218 of the first field plate 208 extends below the insulation layer 220 of the second field plate 210, a thickness t1 of the gate insulation layer 218 of the first field plate 208 is apparently less than the total thickness t2 of the insulation layer 220 and the gate insulation layer 218 of the second field plate 210. However, if the gate insulation layer 218 of the first field plate 208 does not extend below the insulation layer 220 of the second field plate 210, the thickness t1 of the gate insulation layer 218 should also be less than the thickness t3 of the insulation layer 220. Since the insulation layer 220 of the second field plate 210 with the relatively large thickness may withstand greater voltage difference than the gate insulation layer 218 with the relatively small thickness, the breakdown voltage in the edge terminal area 20b may be further increased.

The substrate 200 shown in FIG. 2A includes a first conductive-type substrate 222 (e.g., the N+ substrate) and the first conductive-type epitaxial layer 224 (e.g., the N− epitaxial layer) formed on the first conductive-type substrate 222. The first electrode 202 is in direct contact with a surface of the substrate 200a in the active area 20a, and the active area 20a has at least one trench gate 226 therein. For example, the trench gate 226 has a structure constituted by polysilicon or metal, but the invention is not limited thereto.

Figure 2B:
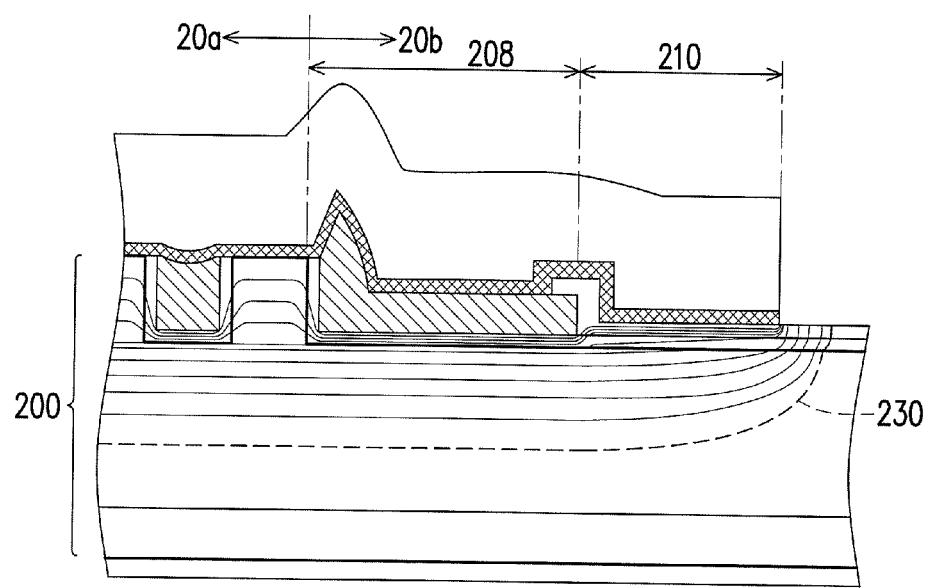
FIG. 2B illustrates a location of a depletion region in the TMBS diode shown in FIG. 2A.

FIG. 2B illustrates a location of a depletion region in the TMBS diode 20 shown in FIG. 2A when the anode voltage is grounded and the cathode voltage is greater than 0 V (i.e., the reverse bias). The thickness of the insulation layer (and the gate insulation layer) of the second field plate 210 is relatively large, and it may withstand a relatively great voltage difference. Accordingly, the second field plate 210 allows the depletion region in the substrate 200 to be expanded toward the edge of the device. This may also be proven by the potential lines in the depletion region 230 and below the first field plate 208 and the second field plate 210. Therefore, the breakdown voltage of the device may be increased.

Figure 3:
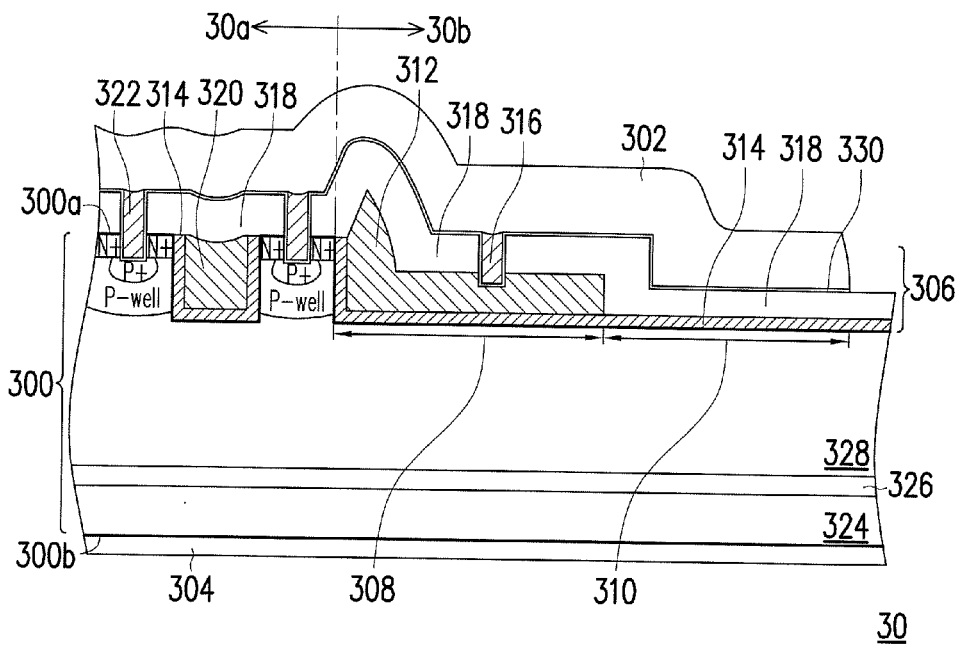
FIG. 3 is a schematic cross-sectional view illustrating a trench IGBT according to a second embodiment of the invention.

FIG. 3 is a schematic cross-sectional view illustrating a trench IGBT according to a second embodiment of the invention. In FIG. 3, the trench IGBT 30 includes an active area 30a and an edge terminal area 30b.

With reference to FIG. 3, the trench IGBT 30 basically includes a substrate 300, a first electrode 302 (i.e., an emitter) located on a surface 300a of the substrate 300, and a second electrode 304 (i.e., a collector) located on a back 300b of the substrate 300. The first electrode 302 is located on the surface 300a of the substrate 300, and the second electrode 304 is disposed on the back 300b of the substrate 300. Here, the second electrode 304 is made of a metal material, e.g., Ti/Ni/Ag or the like. A trench 306 is formed in the surface 300a of the substrate 300 in the edge terminal area 30b beside the active area 30a. A first field plate 308 and a second field plate 310 are disposed in the trench 306. The first electrode 302 extends from the active area 30a to the trench 306 and covers the first field plate 308, and thus the length of the first field plate 308 is less than the length of the first electrode 302 in the edge terminal area 30b. The first field plate 308 includes an L-shaped electric-plate 312, a gate insulation layer 314 below the L-shaped electric-plate 312, and the first electrode 302 above the L-shaped electric-plate 312. The first electrode 302 is electrically connected to the L-shaped electric-plate 312 through at least one first conductive plug 316. The L-shaped electric-plate 312 is made of polysilicon, for instance, and the location and the shape of the L-shaped electric-plate 312 are the same as those of the L-shaped electric-plate described in the first embodiment. The first conductive plug 316 is a tungsten plug, for instance.

With reference to FIG. 3, the second field plate 310 includes at least an insulation layer 318 and the first electrode 302 above the insulation layer 318. The insulation layer 318 covers the tail of the trench 306 and completely covers the L-shaped electric-plate 312. Here, the insulation layer 318 may be made of a material suitable for forming an ILD layer. The first electrode 302 of the second field plate 310 is electrically connected to the L-shaped electric-plate 312 of the first field plate 308 through the first conductive plug 316. At least one trench gate 320 is located in the surface 300a of the substrate 300 in the active area 30a. For example, the trench gate 320 has a structure constituted by polysilicon or metal, but the invention is not limited thereto. The insulation layer 318 completely covers the trench gate 320 in the active area 30a. The first electrode 302 may be electrically connected to N+ source region within the substrate 300 in the active area 30a through at least one second conductive plug 322 that passes through the insulation layer 318. The second conductive plug 322 is a tungsten plug, for instance. The substrate 300 includes a second conductive-type substrate 324 (e.g., the P+ substrate), a first conductive-type buffer layer 326 (e.g., the N+ buffer layer) formed on the second conductive-type substrate 324, and a first conductive-type epitaxial layer 328 (e.g., the N− epitaxial layer) formed on the first conductive-type buffer layer 326. The gate insulation layer 314 may further extend below the insulation layer 318 of the second field plate 310. The gate insulation layer 314 is also located between the trench gate 320 and the first conductive-type epitaxial layer 328. Besides, a barrier layer 330 is located on a surface of the insulation layer 318 and located among the conductive plugs 316 and 322, the first electrode 302, the L-shaped electric-plate 312, and the insulation layer 318, and the barrier layer 330 is made of Ti/TiN, for instance.

Figure 4:
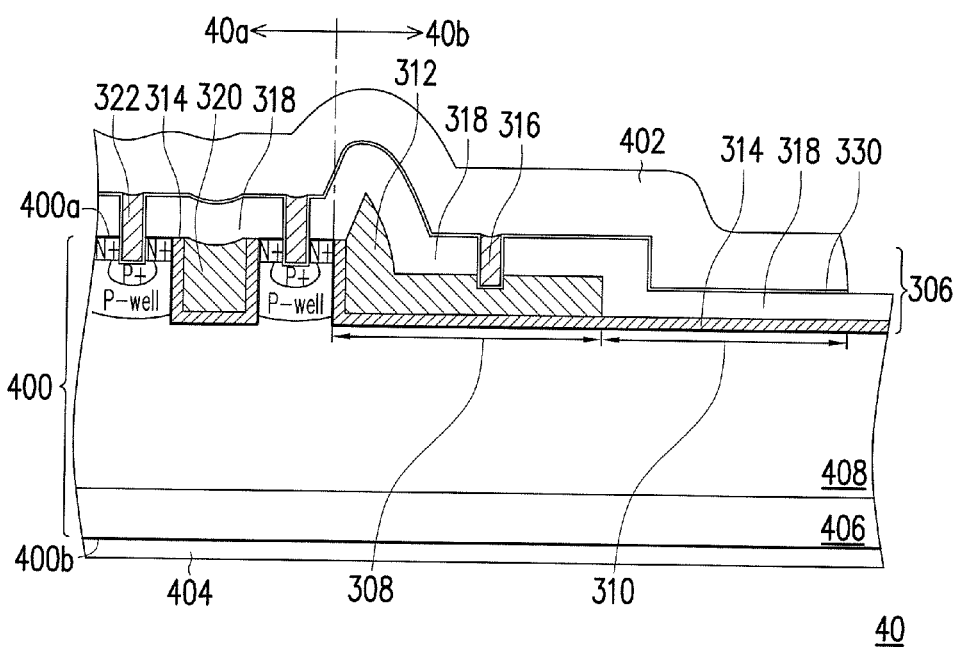
FIG. 4 is a schematic cross-sectional view illustrating a trench power MOSFET according to a third embodiment of the invention.

FIG. 4 is a schematic cross-sectional view illustrating a trench power MOSFET according to a third embodiment of the invention. In FIG. 4, the trench power MOSFET 40 including an active area 40a and an edge terminal area 40b is shown, and the reference symbols and numbers shown in FIG. 3 are also employed herein to represent the same or similar components.

With reference to FIG. 4, the trench power MOSFET 40 basically includes a substrate 400, a first electrode 402 (i.e., a source) located on a surface 400a of the substrate 400, and a second electrode 404 (i.e., a drain) located on a back 400b of the substrate 400. The substrate 400 described in the present embodiment includes a first conductive-type substrate 406 (e.g., the N+ substrate) and the first conductive-type epitaxial layer 408 (e.g., the N− epitaxial layer) formed on the first conductive-type substrate 406. Since other components in the third embodiment are the same or similar to those in the second embodiment, detailed descriptions thereof are omitted.

To sum up, in the structural design described in the embodiments of the invention, the length and the thickness of the electric-plate in the edge terminal area are both increased, so as to expand the depletion region. Moreover, the breakdown voltage is further increased.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. An edge terminal structure of a trench power semiconductor device, wherein the power semiconductor device is a trench power metal oxide semiconductor field effect transistor and comprises an active area and an edge terminal area, the edge terminal structure comprising:
   a first conductive-type substrate;
   a first conductive-type epitaxial layer formed on the first conductive-type substrate, wherein a trench being located in a surface of the first conductive-type epitaxial layer in the edge terminal area beside the active area;
   a first electrode located on the surface of the first conductive-type epitaxial layer;
   a second electrode located on a back of the first conductive-type substrate;
   a first field plate disposed on a sidewall of the trench and extending toward a tail of the trench, wherein the first field plate comprises at least an L-shaped electric-plate, a gate insulation layer below the L-shaped electric-plate, and the first electrode on the L-shaped electric-plate; and
   a second field plate comprising a portion of the first electrode and at least an insulation layer between the portion of the first electrode and the first conductive-type epitaxial layer, wherein the second field plate is free of the L-shaped electric-plate, the insulation layer covers the tail of the trench and further extends to completely cover the L-shaped electric-plate of the first field plate.

2. The edge terminal structure of the trench power semiconductor device as recited in claim 1, further comprising a conductive plug, and the conductive plug passes through the insulation layer and is electrically connected to the first electrode and the L-shaped electric-plate.

3. The edge terminal structure of the trench power semiconductor device as recited in claim 2, further comprising a barrier layer located on a surface of the insulation layer and among the conductive plug, the first electrode, the L-shaped electric-plate, and the insulation layer.

4. A trench power metal oxide semiconductor field effect transistor having an active area and an edge terminal area and comprising:
   a first conductive-type substrate;
   a first conductive-type epitaxial layer formed on the first conductive-type substrate, wherein a trench being formed on a surface of the first conductive-type epitaxial layer in the edge terminal area beside the active area;
   a plurality of trench gates located in the surface of the first conductive-type epitaxial layer in the active area;
   a first electrode located at the active area and on the surface of the first conductive-type epitaxial layer in the edge terminal area, wherein the first electrode covers the trench gates;
   a second electrode located on a back of the first conductive-type substrate;

a first field plate disposed on a sidewall of the trench and extending toward a tail of the trench, the first field plate comprises at least an L-shaped electric-plate, a gate insulation layer below the L-shaped electric-plate, and the first electrode on the L-shaped electric-plate; and a second field plate comprising a portion of the first electrode and at least an insulation layer between the portion of the first electrode and the first conductive-type epitaxial layer, wherein the second field plate is free of the L-shaped electric-plate, the insulation layer covers the tail of the trench and further extends to completely cover a tail of the L-shaped electric-plate of the first field plate.

5. The trench power metal oxide semiconductor field effect transistor as recited in claim 4, wherein the first electrode is a source, and the second electrode is a drain.

6. The trench power metal oxide semiconductor field effect transistor as recited in claim 4, further comprising:

a first conductive plug passing through the insulation layer and being electrically connected to the first electrode and the L-shaped electric-plate; and a second conductive plug passing through the insulation layer and being electrically connected to the first electrode and the first conductive-type epitaxial layer in the active area.

7. The trench power metal oxide semiconductor field effect transistor as recited in claim 6, further comprising a barrier layer located on a surface of the insulation layer and among the first and second conductive plugs, the first electrode, the L-shaped electric-plate, and the insulation layer.

* * * * *